US011173486B2

(12) United States Patent
Colgan et al.

(10) Patent No.: US 11,173,486 B2
(45) Date of Patent: Nov. 16, 2021

(54) FLUIDIC CAVITIES FOR ON-CHIP LAYERING AND SEALING OF SEPARATION ARRAYS

(71) Applicant: International Business Machines Corporation, Armonk, NY (US)

(72) Inventors: Evan Colgan, Montvale, NJ (US); Joshua T. Smith, Croton on Hudson, NY (US); Benjamin Wunsch, Mt. Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 238 days.

(21) Appl. No.: 16/274,532

(22) Filed: Feb. 13, 2019

(65) Prior Publication Data

US 2020/0254446 A1  Aug. 13, 2020

(51) Int. Cl.
| | | |
|---|---|---|
| *B81B 7/00* | (2006.01) | |
| *B81C 1/00* | (2006.01) | |
| *B01L 3/00* | (2006.01) | |
| *G01N 15/02* | (2006.01) | |

(52) U.S. Cl.
CPC ... *B01L 3/502707* (2013.01); *B01L 3/502715* (2013.01); *B01L 3/502761* (2013.01); *B81B 7/0061* (2013.01); *B81C 1/00111* (2013.01); *B81C 1/00309* (2013.01); *G01N 15/0255* (2013.01); *B01L 3/502723* (2013.01); *B01L 3/502753* (2013.01); *B01L 2200/0652* (2013.01); *B01L 2200/0689* (2013.01); *B01L 2300/12* (2013.01); *B81B 2201/058* (2013.01); *B81B 2203/0361* (2013.01); *G01N 2015/0288* (2013.01)

(58) Field of Classification Search
CPC .................. B01L 3/502707; B81C 1/00309
See application file for complete search history.

(56) References Cited

U.S. PATENT DOCUMENTS

| | | | | |
|---|---|---|---|---|
| 6,071,822 A | * | 6/2000 | Donohue | ............ H01L 21/3065 438/712 |
| 7,285,226 B2 | | 10/2007 | Bengali | |
| 8,608,291 B2 | | 12/2013 | Guan et al. | |
| 9,617,149 B2 | | 4/2017 | Lagae et al. | |
| 9,636,675 B2 | | 5/2017 | Astier et al. | |
| 9,700,891 B2 | | 7/2017 | Smith et al. | |
| 9,795,964 B2 | | 10/2017 | Smith et al. | |

(Continued)

FOREIGN PATENT DOCUMENTS

| | | |
|---|---|---|
| CN | 107262171 A | 10/2017 |
| WO | 2015145280 A1 | 10/2015 |

OTHER PUBLICATIONS

List of IBM Patents or Patent Applications Treated as Related; (Appendix P), Jan. 29, 2021, 2 pages.

(Continued)

*Primary Examiner* — Moazzam Hossain
(74) *Attorney, Agent, or Firm* — Cantor Colburn LLP; Kristofer Haggerty

(57) ABSTRACT

A method for fabricating a fluidic device includes depositing a sacrificial material on a pillar array arranged on a substrate. The method also includes removing a portion of the sacrificial material. The method further includes depositing a sealing layer on the pillar array to form a sealed fluidic cavity.

3 Claims, 17 Drawing Sheets

(56) References Cited

U.S. PATENT DOCUMENTS

| | | | |
|---|---|---|---|
| 2004/0028875 A1* | 2/2004 | Rijn | B01D 67/002 428/98 |
| 2004/0209392 A1* | 10/2004 | Craighead | H01L 21/00 438/48 |
| 2010/0068105 A1 | 3/2010 | Green | |
| 2015/0069618 A1 | 3/2015 | Gudeman et al. | |
| 2017/0038285 A1* | 2/2017 | Zheng | G01N 1/405 |

OTHER PUBLICATIONS

Colgan et al., "Fluidic Cavities For On-Chip Layering and Sealing of Separation Arrays", U.S. Appl. No. 17/162,002; filed Jan. 29, 2021.

B. H. Wunsch, et al., "High throughput colloid separation on single layer nanofluidic chip," Patent Ref P201701088US01, U.S. Appl. No. 15/815,846, filed Nov. 17, 2017.

B. H. Wunsch, et al., Nanoscale lateral displacement arrays for the separation of exosomes and colloids down to 20 nm, Nat. Nanotech., vol. 11, pp. 936-940, 2016.

David W. Inglis et al., "Critical particle size for fractionation by deterministic lateral displacement", First published as an Advance Article on the web Mar. 17, 2006, The Royal Society of Chemistry 2006, Lab Chip. 2006, 6, 655-659.

F. Niklaus, "Adhesive wafer bonding", Journal of Applied Physics 99, © 2006 American Institute of Physics, ops 031101-1 thru 031101-28.

J. Cooper McDonald, "Fabrication of microfluidic systems in poly(dimethylsiloxane)", Electrophoresis 2000, 21, pp. 27-40.

John A. Davis et al., "Deterministic hydrodynamics: Taking blood apart", PNAS, Oct. 3, 2006, vol. 103, No. 40, pp. 14779-14784.

Joshua T. Smith et al., "Integrated nanoscale deterministic lateral displacement arrays for separation of extracellular vesicles from clinically-relevant volumes of biological samples", This journal is © The Royal Society of Chemistry 2018, Chip, 2018, Lab Chip, 18, 3913-3925 pp. 3913-3925.

Keith J. Morton et al., "Hydrodynamic metamaterials: Microfabricated arrays to steer, refract, and focus streams of biomaterials", PNAS, May 27, 2008, vol. 105, No. 21. pp. 7435-7438.

List of IBM Patents or Patent Applications Treated as Related; (Appendix P), Feb. 13, 2019, 2 pages.

Lotien Richard Huang et al., "Continuous Particle Separation Through Deterministic Lateral Displacement", May 14, 2004 vol. 304 Science, www.sciencemag.org, 5 pps.

T. Smith, et al., "Microfluidic chips with one or more vias", Patent Ref: P201708136US01, U.S. Appl. No. 15/875,940, filed Jan. 19, 2018.

Zhi-Jian Jia, "Bonding of Glass Microfluidic Chips at Room Temperatures", Anal. Chern. 2004, 76, pp. 5597-5602.

* cited by examiner

US 11,173,486 B2

FLUIDIC CAVITIES FOR ON-CHIP LAYERING AND SEALING OF SEPARATION ARRAYS

BACKGROUND

The present invention generally relates to particle separation arrays. More specifically, the present invention relates to fabrication methods and resulting structures configured to form fluidic cavities for on-chip layering and sealing of separation arrays.

There is extensive and growing interest in fluidic technologies such as lab-on-a-chip (LOC). Fluidic technologies provide advantages over traditional laboratory methods, such as the ability to carry out separation and detection with high resolution and sensitivity; the need for only very small quantities of sample and reagent; the relatively small footprint of the chip's analytical devices; low manufacturing cost; and short analysis time.

Deterministic lateral displacement (DLD) is a microfluidic LOC technology that uses passive pillar arrays to separate particles based on size. Particles with a size greater than the critical dimension are "bumped" through the pillar array, while particles having a size smaller than the critical dimension "zigzag" through the array in the direction of fluid flow. The different flow paths, based on size of the particles, enable particle separation. DLD pillar arrays are used in a variety of applications, including for example, cell sorting and biosensors.

SUMMARY

Embodiments of the present invention are directed to a method for fabricating a fluidic device. A non-limiting example of the method includes depositing a sacrificial material on a pillar array arranged on a substrate. The method also includes removing a portion of the sacrificial material. The method further includes depositing a sealing layer on the pillar array to form a sealed fluidic cavity.

Another non-limiting example of the method includes depositing a sacrificial material on a pillar array arranged on a substrate. The method includes depositing an oxide layer on the sacrificial material and the pillar array. The method includes forming a vent hole in the oxide layer. The method includes flowing a material through the vent hole to extract at least a portion of the sacrificial material. The method includes depositing a sealing layer on the pillar array to form a sealed fluidic cavity.

Embodiments of the present invention are directed to a fluidic device. A non-limiting example of the fluidic device includes a first pillar array arranged on a substrate. The first pillar array includes a plurality of pillars and a plurality of extraction columns. Each extraction column includes an access opening. The fluidic device also includes a sealing layer arranged on the first pillar array to form a sealed fluidic cavity.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 4-7 depict a process flow for fabricating a fluidic device according to embodiments of the present invention, in which:

FIG. 4 depicts a perspective view of the fluidic device, subsequent to forming a pillar array;

FIG. 5 depicts a perspective view of the fluidic device, subsequent to depositing a sacrificial material on the pillar array;

FIG. 7 depicts a perspective view of the fluidic device, subsequent to depositing a third oxide layer and forming an access hole;

FIGS. 9A-9E depict a process flow using an extraction column according to embodiments of the present invention, in which:

FIG. 9A depicts a perspective view of an extraction column;

FIG. 9B depicts a perspective view of the extraction column, subsequent to depositing a sacrificial material;

FIG. 9C depicts a perspective view of the extraction column, subsequent to depositing an oxide layer and forming a vent hole;

FIG. 9D depicts a perspective view of the extraction column, subsequent to extracting the sacrificial material; and FIG. 9E depicts a perspective view of the extraction column, subsequent to closing the vent hole;

Figure 1A:
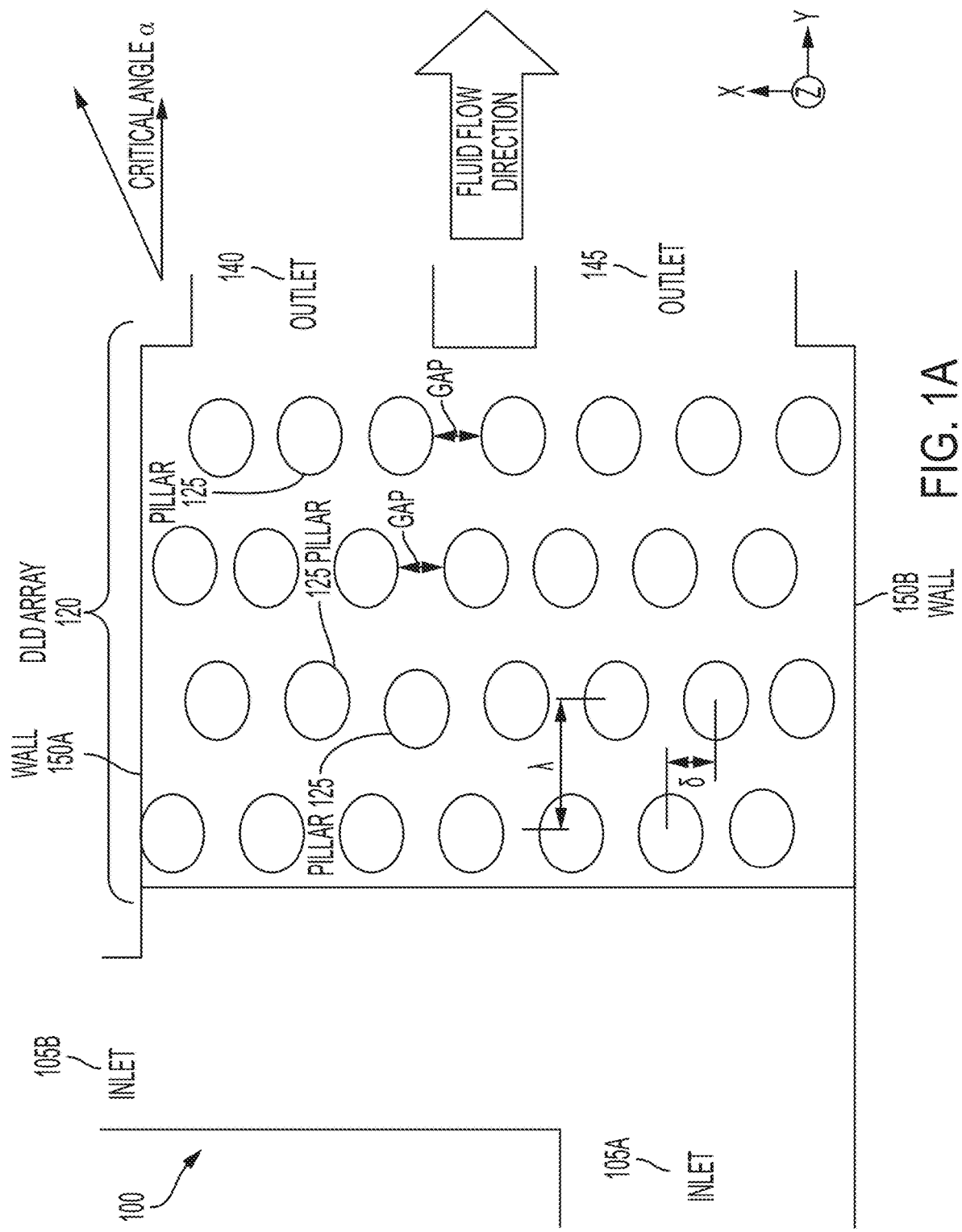
FIG. 1A depicts a DLD array according to embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to DLD arrays (or deterministic lateral displacement (DLD) devices) may or may not be described in detail herein. Moreover, the various tasks and process steps described herein can be incorporated into a more comprehensive procedure or process having additional steps or functionality not described in detail herein. In particular, various steps in the manufacture of DLD arrays are well known and so, in the interest of brevity, many conventional steps will only be mentioned briefly herein or will be omitted entirely without providing the well-known process details.

Turning now to an overview of technologies that are more specifically relevant to aspects of the invention, LOC technologies, such as microfluidic DLD, use small sample quantities. Recovering sorted material from such small volumes can be challenging, particularly when sorted material includes collecting rare biological events. Accordingly, sample volumes sufficient for collection must pass through the chip.

Another challenge for LOC technologies is sealing the fluidic chips prior to use. The chips must be sealed to protect the device from fluids and contaminants during downstream processing. Various approaches have been used to seal the fluidic cells. For example, poly(dimethylsiloxane) (PMDS), a soft elastomer, has been used to seal the cells. PDMS is optically transparent and easy to use to create structures using soft lithography. Using PDMS, negative patterns can be quickly replicated by spinning the material onto structures patterned in resist, and then curing, removing, and bonding the material and structures to a target substrate without the need for downstream processing. Despite these advantages, PDMS does not have sufficient chemical and thermal stability for some applications, and therefore, it is not compatible with advanced semiconductor processing techniques that can add further functionality and scaling, e.g., sorting and detection of nanoscale biological material.

Another approach for sealing fluidic chips is glass bonding. The mechanical stability of silicon and glass make them useful in the younger field of nanofluidics where rigid features precisely control dimensions that are not accessible to PDMS fluidic structures. Additionally, silicon offers a process advantage. Anodic bonding can be used to seal glass to pieces of silicon that have micro/nanofluidic features, without the need for an adhesion layer that can redefine or constrict fluidics. The glass acts as a ceiling to encapsulate the micro-mechanical silicon elements. Typically, glass bonding to silicon or silicon dioxide occurs through rigorous and labor intensive cleaning and preparation measures. Afterward, pressure is applied to ensure a sufficient seal without breaking the glass or silicon. However, another challenge is that fluidic access holes must be drilled into the glass coverslip to provide an entrance and exit for fluidics flowing into and out of the chip, which is technically challenging on very flat and thin pieces of glass. The size and alignment of these access holes to the chip-level features also limit the level of integration that can be incorporated. Finally, long anneals are typically applied to strengthen the glass-silicon bond. However, silicon and glass sealing approaches cannot be used to manufacture chips on a large scale, and glass sealing cannot be used to integrate complex microelectronics.

Turning now to an overview of the aspects of the invention, one or more embodiments of the invention address the above-described shortcomings of the prior art by providing methods and resulting structures that include filling fluidic sorting pillar arrays with a sacrificial material (e.g., polysilicon) that can be subsequently extracted post-fabrication. An extraction gas (e.g., xenon difluoride, XeF2) can be used to open the microfluidic cavities. The microfluidics are also encapsulated in an oxide material, which permits simple preparation and use. Extraction columns and vent holes are manufactured into the sorting arrays/microfluidic channels to extract the sacrificial material from specific regions of the microfluidic structures, which permits rapid clearing of sacrificial material isolated to the fluidic access ports post-processing. The encapsulated fluidic structures can then be stacked as layers.

The above-described aspects of the invention address the shortcomings of the prior art by using filled or partially filled (i.e., filled only near the fluidic access ports) fluidic features during fabrication to permit unrestrained processing and cleaning without yield loss to create multiple layers sealed in an oxide. Encapsulating and stacking fluidic structures improves volume throughput, thereby aiding in rapid sample collection, and reducing the manufacturing cost.

Turning now to a more detailed description of aspects of the present invention, fluidic devices, for example a pillar sorting array such as DLD array 120 shown in FIG. 1A can be used to separate particles based on size. The DLD array 120 can be implemented as a configuration of nanoDLD arrays or microDLD arrays according to some embodiments of the present invention. Although DLD array 120 is shown as an exemplary embodiment of the present invention, it is noted that the described methods and devices are not limited to DLD array 120, as they are but one example of a suitable fluidic device. Other fluidic devices, including other devices including sorting pillar arrays, can be used.

Figure 1B:
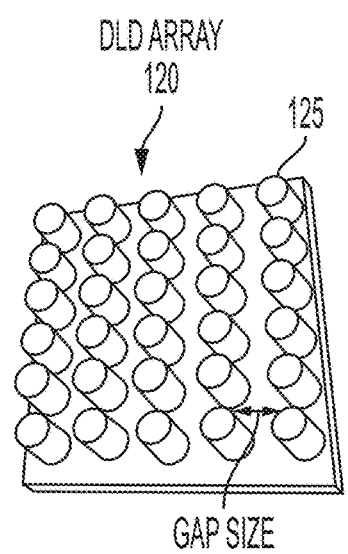
FIG. 1B depicts an enlarged view of the DLD array according to embodiments of the present invention.
Figure 2:
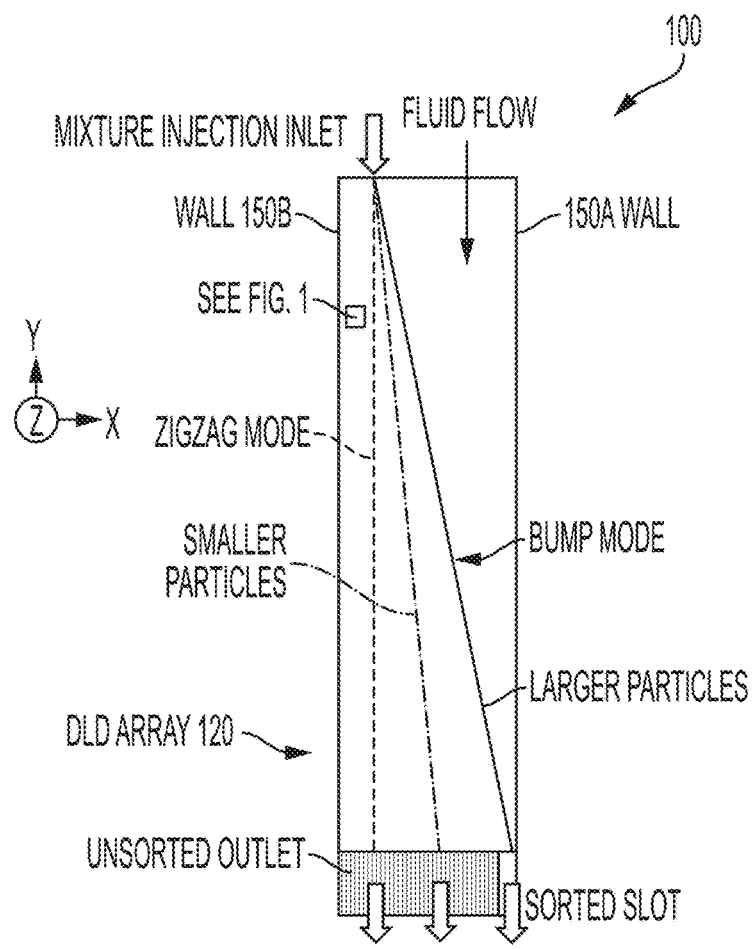
FIG. 2 depicts flow through a DLD array according to embodiments of the present invention.

FIGS. 1A, 1B, 2, and 3 illustrate how a DLD array 120 and a machine 300 including a DLD array 120 are used. FIG. 1A depicts a chip 100 with a DLD array 120, which is a fluidic device, according to embodiments of the present invention. FIG. 1B is an enlarged view of the DLD array 120. FIG. 2 is a diagram that depicts how particles and fluid can flow through the DLD array 120 in accordance with aspects of the invention.

As best shown in FIG. 1A, the DLD array 120 includes an array of pillars 125. The chip 100 has at least one inlet 105A to receive fluid containing particles to be separated. The inlet 105A can be an opening or hole in the walls around the DLD array 120 or can span the width of the DLD array 120 through which fluid (e.g., water, electrolyte solutions, organic solvents, etc.) and the mixture of particles can flow. In one implementation, there can be two or more inlets 105A and 105B. In this case, the inlet 105A receives input of the mixture to be sorted, and the mixture can be in a fluid (such as an electrolyte solution). The inlet 105B can be utilized to input a fluid, such as a buffer, not containing the mixture of the particles.

Particles having a size greater than the critical dimension are bumped (i.e., bump mode, see FIG. 2) through the DLD array 120 in the direction of the critical angle α, and fragments larger than the critical dimension are laterally displaced in the x-axis and collected at outlet 140. The critical dimension is the size (e.g., diameter or length) of a particle that is too large to zigzag through the DLD array 120. On the other hand, particles having a size smaller than the critical dimension zigzag (i.e., zigzag mode, see also FIG. 2) through the DLD array 120 in the direction of fluid flow, and these smaller particles are collected (with very little lateral displacement and/or relatively no lateral displacement in the x-axis) at the outlet 145. The particles having the size smaller than the critical dimension follow the direction of the fluid flow, and are sorted through the outlet 145. The outlets 140 and 145 can be openings through which the sorted particles can flow and be collected in bins after sorting. It is appreciated that although only two outlets 140 and 145 are depicted, there can more than two outlets to provide more sorted particles.

The DLD array 120 is a deterministic lateral displacement (DLD) array with predefined array parameters. The pillars 125 are periodically arranged with spacing λ, and each downstream row (rows run in the x-axis) is offset laterally from the previous row by the amount δ breaking the symmetry of the array. This array axis forms an angle $\alpha = \tan^{-1}(\delta/\lambda) = \tan^{-1}(\varepsilon)$ with respect to the channel walls 150A, 150B and therefore the direction of fluid flow. Because of the array asymmetry, fluid flow in the gaps (Gaps) between the posts/pillars G is partitioned into 1/ε slots. Each of these slots repeats every 1/ε rows so the flow through the array is on average straight. Particles transiting the gap G near a post can be displaced into an adjacent streamline if the particle's radius, or effective radius in the case of tumbling oblong objects such as rods with a defined length, is larger than the slot width in the gap. Therefore, larger fragments are deterministically displaced at each post and migrate at an angle α (critical angle) to the flow. Smaller fragments simply follow the streamline paths and flow through the array in the direction of fluid flow.

During operation, particles greater than the predefined critical size are displaced laterally (in the x-axis) at each row by a pillar 125 and follow a deterministic path through the array in the so-called "bumping" or "bump" mode (see also FIG. 2). The trajectory of bumping particles follows the array axis angle α. Particles smaller than the critical size follow the flow streamlines, weaving through the post array in a periodic "zigzag" mode (see also FIG. 2). Therefore, array elements can be tailored to direct specific particle sizes at an angle to the flow by building arrays with design parameters shown in FIG. 2, which include obstacle size/length, spacing between the posts/pillars G, and post/pillar pitch λ. As noted above, asymmetry is determined by the magnitude of the row-to-row shift δ and is characterized by the slope ε=δ/λ, then leading to the final array angle being $\alpha = \tan^{-1}(\varepsilon)$. For a given array angle, the critical particle size for the bumping mode is determined by the ratio between the particle diameter and the pillar spacing and/or gap.

It should be appreciated that the array elements and any ancillary fluidic channels and reservoirs can be fabricated in silicon wafers by using standard microfabrication techniques including photolithography and etching. Arrays can also be molded in polydimethylsiloxane (PDMS) by using similarly crafted silicon.

Figure 3:
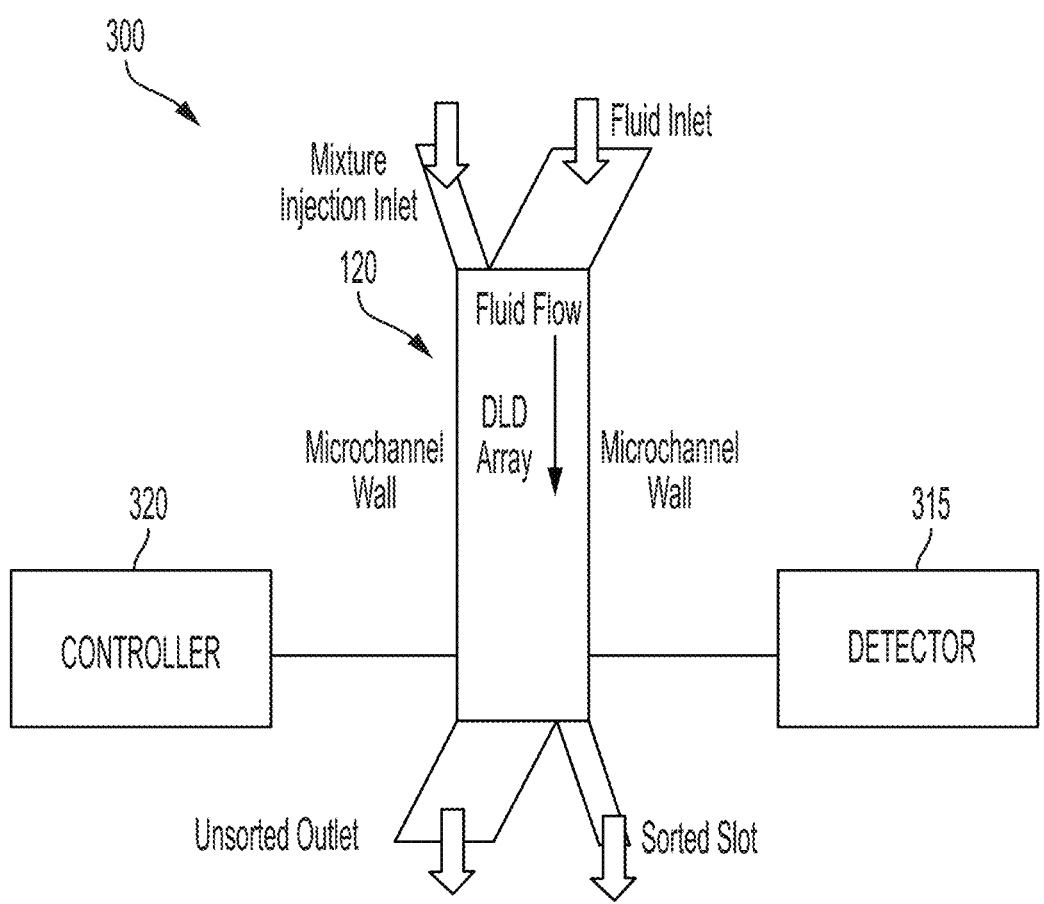
FIG. 3 depicts a machine including a DLD array according to embodiments of the present invention.

FIG. 3 depicts a machine layout of a machine 300 that integrates a DLD chip according to one or more embodiments. The machine 300 can be used to perform any of the methods described herein that utilize a DLD chip and/or DLD array 120. The machine 300 can include a housing or encasing (not shown) which integrates a DLD chip and any fluidic networks and injection ports required for transporting fluid samples into and off of the DLD chip, as well as injecting/extracting fluid from the housing. The DLD array 120 includes a mixture injection port for injecting the samples. A syringe pump (not shown), which can be controlled by controller 320, can be used to inject the samples and fluids. However, in some embodiments of the invention, the samples also can be manually injected. The DLD array 120 optionally includes another fluid inlet for injecting fluids. A detector 315 can be attached or mounted to the DLD array 120 or can be a separate portable unit. The detector 315 can be a full-sized fluorescence microscope for example. The output of the detector 315 can be fed into the controller 320. In a general operation, a complex mixture of particles is fed into the DLD array 120 through the injection inlet. The controller 320 can control the sample injection, flow, and/or detector, for example. The controller 320 can include a processor that is communicatively connected to an input device, a network, a memory, and a display. In some embodiments, the controller 320 can include a personal computer, smart phone or tablet device communicatively connected to the fabrication machine 1000.

Figure 4:
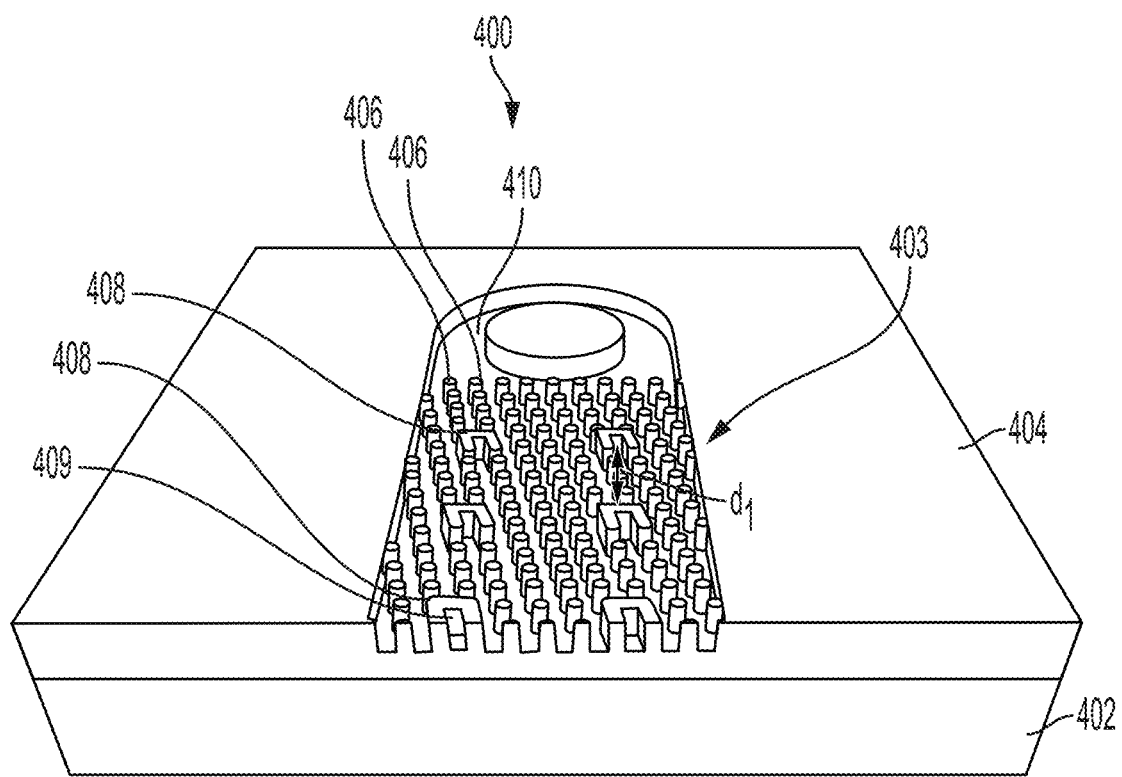

FIGS. 4-7 depict a process flow for fabricating a fluidic device 400 (also referred to as a fluidic device) according to embodiments of the present invention. FIG. 4 depicts a perspective view of the fluidic device 400, subsequent to forming a pillar array 403 on a substrate 402. The pillar array 403 includes a plurality of pillars 406 that each include an oxide material 404 (also referred to as first oxide layer), for example, silicon dioxide ($SiO_2$).

According to one or more embodiments of the present invention, the pillars 406 of the pillar array 403 are formed by etching a thick layer of silicon dioxide. The oxide material 404 has a thickness of about 0.5 to about 10 micrometers according to some embodiments of the present invention. The oxide material 404 has a thickness of about 1 to about 2 micrometers according to other embodiments of the present invention.

According to other embodiments of the present invention, pillars 406 of the pillar array 403 are etched in silicon, and then a layer of oxide (e.g., silicon dioxide) is grown or deposited on the surface of the silicon pillars to form a single layer. Non-limiting examples of materials for the substrate 402 include germanium, III-V semiconductors (e.g. GaAs), quartz, or a combination thereof.

Figure 8:
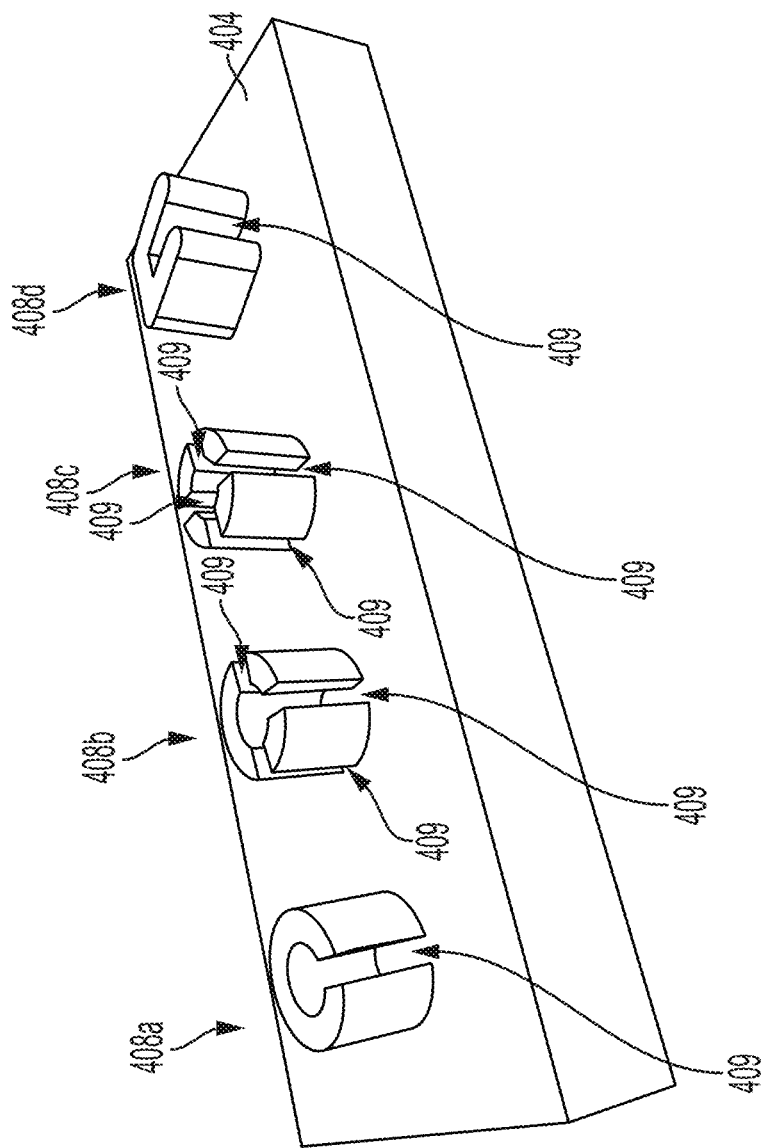
FIG. 8 depicts a perspective view of extraction columns according to embodiments of the present invention.

Extraction columns 408 are also formed in the oxide material 404, within the pillars 406 of the pillar array 403. The extraction columns 408 are structures that include an access opening 409 within the center of the column. Non-limiting examples of extraction columns 408 are shown in FIG. 8. Each extraction column 408, 408a, 408b, 408c, as shown in FIG. 8, includes one or more access openings 409. The extraction column 408a includes an access opening 409 that includes a single slit within the sidewall of the column, which provides unidirectional slit access to the exterior of the extraction column 408a. The extraction column 408b includes an access opening 409 that includes three slits within the sidewall of the column, which provides tri-directional slit access to the exterior of the extraction column 408b. The extraction column 408c includes an access opening 409 with four slits within the sidewall of the column, which provides quad-directional access to the exterior of the extraction column 408c. The extraction column 408 includes an angled inverted U-shaped structure with an access opening 409 that includes a rear-facing (in the direction of fluid flow, see FIG. 2) access opening 409.

Turning again to FIG. 4, each extraction columns 408 of the plurality is arranged at intervals within the pillar array 403. The extraction columns 408 are spaced apart with a center-to-center distance ($d_1$) of about 1 to about 50 micrometers according to some embodiments of the present invention. According to other embodiments of the present invention, the extraction columns 408 are spaced apart with a center-to-center distance ($d_1$) of about 10 to about 20 micrometers.

Figure 5:
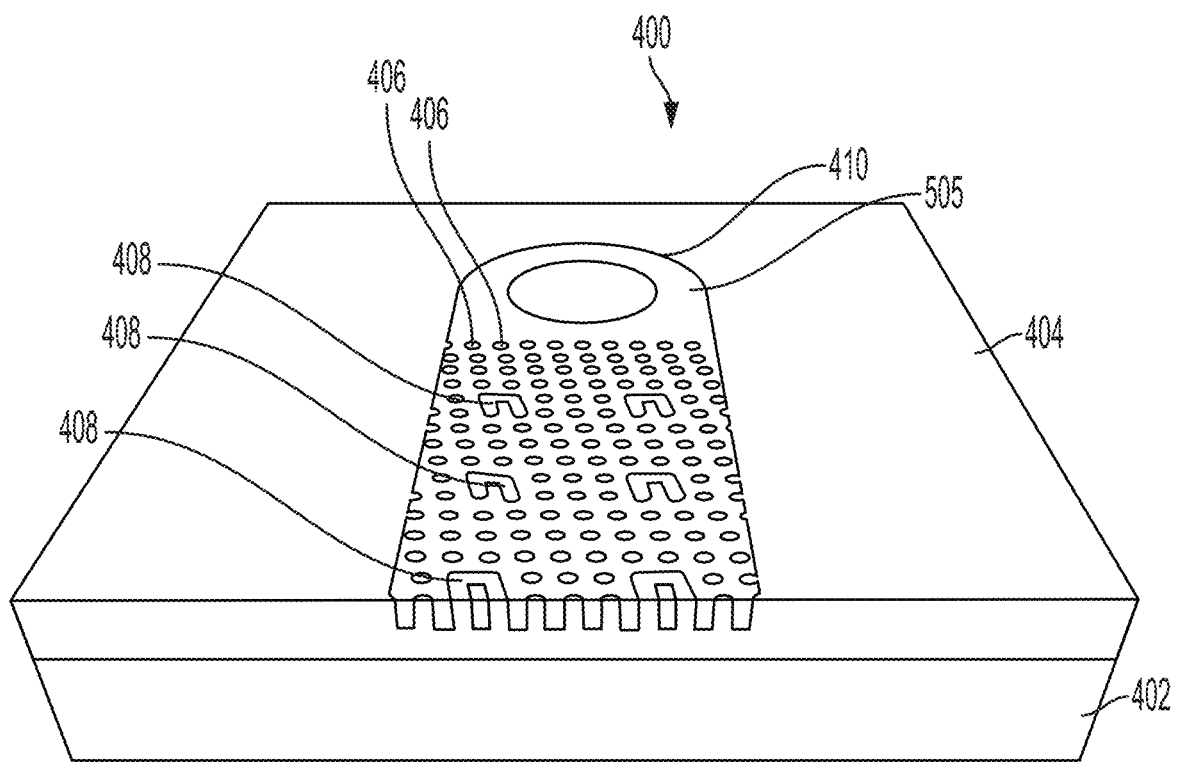
Figure 6B:
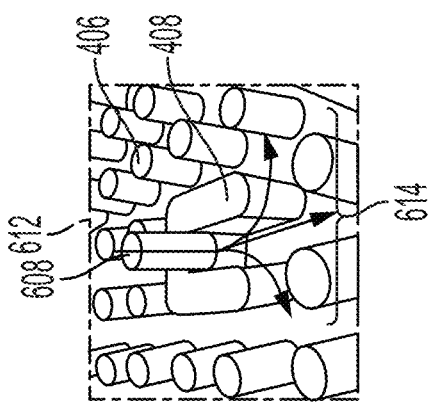
FIG. 6B depicts an enlarged view of a vent hole aligned with an extraction column.
Figure 6A:
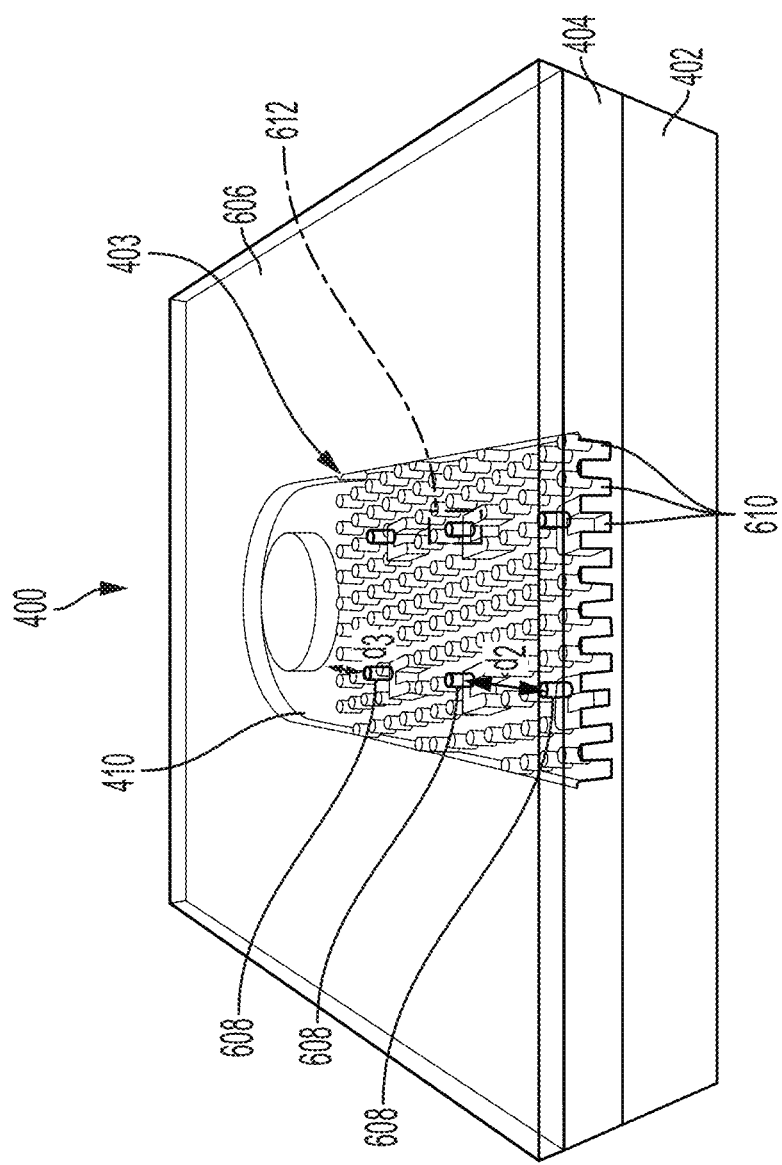
FIG. 6A depicts a perspective view of the fluidic device, subsequent to depositing a second oxide layer, forming vent holes, and partially removing the sacrificial material.

The extraction columns 408 provide structural reinforcement of the ceiling by offering pillar 406 support (after the second oxide layer 606 is deposited, see FIG. 6A). Each extraction column 408 will also house a vent hole 608 (see FIG. 6A) in the center of the column, which will be used to extract the surrounding sacrificial material 505 (see FIG. 5) used to temporarily support the oxide ceiling (second oxide layer 606, see FIG. 6A) during deposition. After the sacrificial material 505 is extracted, ceiling oxide (second oxide layer 606) creates a seal for the newly formed microfluidic cavity. Centering the vent holes 608 (see FIG. 6A) within the extraction columns 408 keeps bubbles and deposited oxide used to close the vent holes 608 isolated internally within the pillars 406.

A portion of the oxide layer 404 in an area 410 adjacent to the pillar array 403 is also removed, down to about the level of the base of the pillars 406 of the pillar array 403. The sacrificial material 505 subsequently deposited (see FIG. 5) on the pillar array 403 will also fill the area 410. After the second oxide layer 606 (see FIG. 6A) is deposited and the sacrificial material 505 is removed (see also FIG. 6A), the area 410 filled with the sacrificial material 505 will serve as a plug to seal and protect the newly formed fluidic cavities during subsequent processing.

FIG. 5 depicts a perspective view of the fluidic device 400, subsequent to depositing a sacrificial material 505 on the pillar array 403 and within the sealing area 410. The sealing area 410 including the sacrificial material 505 will form the access reservoir (also referred to as access port) that prevents wicking of process fluids into the pillar array 403 during the remaining fabrication steps. The sacrificial material 505 is polished back to the surface of the pillar array 403 features, such that the pillars 406 and extraction columns 408 are exposed, by for example, chemical mechanical planarization (CMP), to remove topography and to remove material from the surface of the oxide layer 404. The sacrificial material 505 is, for example, polysilicon according to some embodiments of the present invention.

FIG. 6A depicts a perspective view of the fluidic device 400, subsequent to depositing a second oxide layer 606, forming vent holes 608, and partially removing the sacrificial material 505. The second oxide layer 606 can the same or different than the first oxide layer 404. The second oxide layer 606 is, for example, silicon dioxide. Lithography and etching can be used to form the vent holes 608 in the second oxide layer 606. Each vent hole 608 is aligned over the center of an extraction column 408, as shown in the enlarged view 612 in FIG. 6B. The vent holes 608 are used to extract the sacrificial material 505 from the pillar array 403. The single layer level extraction process is useful for very large area arrays with lateral etching distances, for example, on the order of millimeter length scales.

The center-to-center distance ($d_2$) between each of the vent holes 608 is about 1 to about 50 micrometers according to some embodiments of the present invention, which is the same as the center-to-center distance ($d_1$) as the extraction columns 408 (see FIG. 4). According to other embodiments of the present invention, the center-to-center distance ($d_2$) between each of the vent holes 608 is about 10 to about 20 micrometers.

The second oxide layer 606 in which the vent holes 608 are formed has a thickness of about 0.5 to about 10 micrometers according to some embodiments of the present invention. The second oxide layer 606 has a thickness of about 0.5 to about 2 micrometers according to other embodiments of the present invention.

The distance ($d_3$) between the vent hole 608 closest to the sealing area 410 which will form the access reservoir is much larger than the distance ($d_2$) between the vent holes 608, which enables a plug of the sacrificial material 505 to reliably form in the reservoir that seals and prevent wicking during subsequent processing. Having a larger distance ($d3$) compared to ($d2$) between the vent holes 608 also permits the final sacrificial material 505 in the sealing area 410 to be rapidly extracted in the final stages of processing, instead of slowly removing the material over a long time.

The distance ($d_3$) between an edge of a vent hole 608 closest to the sealing area 410 and an edge of the sealing area 410 is about 1 to about 50 micrometers according to some embodiments of the present invention. According to other embodiments of the present invention, the distance ($d_3$) between an edge of a vent hole 608 and an edge of the sealing area 410 is about 5 to about 10 micrometers.

As shown in FIG. 6B, the vent hole 608 is aligned with the center of the extraction column 408. Any methods and materials can be used to extract the sacrificial material 505 from the pillar array 403 area. Any material or etchant, such as a gas such as $XeF_2$, can be used to extract the sacrificial material 505 from the pillar array 403. The etchant used to push the sacrificial material 505 out from within the pillar array 403 will follow the flow path 614 indicated by the arrows shown in FIG. 6B. The etchant will flow through the vent hole 608 in the second oxide layer 606 and into the center of the extraction column 408. The sacrificial material 505 within the extraction column will flow out of the extraction column 408. Surrounding sacrificial material 505 around the extraction column 408 and between the pillars 406 of the pillar array 403 to be removed, resulting in formation of a fluidic cavity with openings 610 between the pillars 406 of the pillar array 403. The sacrificial material 505 filing the sealing area 410 adjacent to the pillar array 403 is not extracted when the material or etchant is flowed through the vent hole 608.

The extraction columns 408 internally house the vent holes 608 to suppress and contain the impact of the vent holes 608 on the behavior of fluidics during operation, e.g., by influencing bubble trapping in the vent holes 608.

Figure 7:
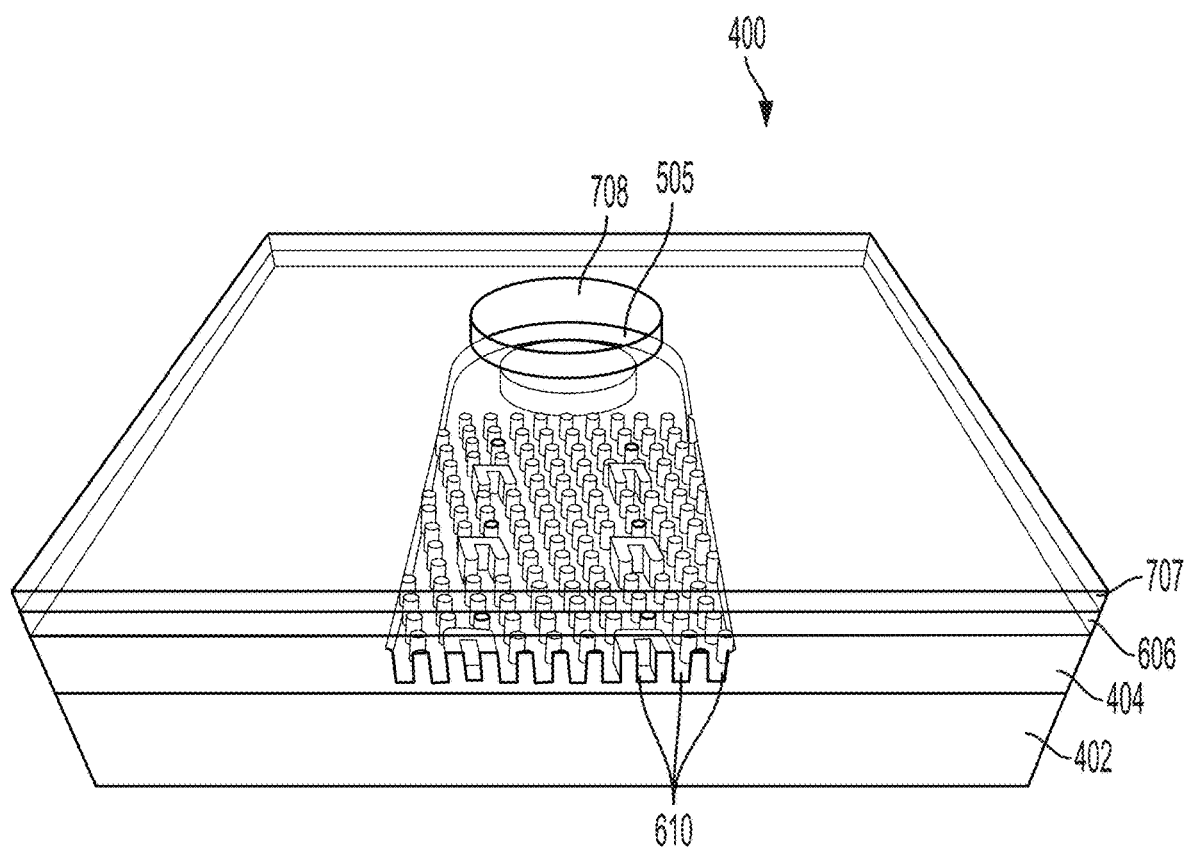

FIG. 7 depicts a perspective view of the fluidic device 400, subsequent to depositing a third oxide layer 707 and forming an access hole 708 within the third oxide layer 707. The third oxide layer 707 is the same or different than oxide material layer 404 and second oxide layer 606. The third oxide layer 707 forms a sealing layer that covers and seals the vent holes 608 and fluidic cavity within the pillar array 403 beneath. The third oxide layer 707 is deposited by, for example, plasma enhanced chemical vapor deposition (PECVD) which will "pinch off" or close the vent holes 608.

An access hole 708 is formed in the sealing third oxide layer 707 to provide access to the sealing area 410 with the sacrificial material 505 plug. When the fluidic device 400 is ready for use, the sacrificial material 505 plug is removed from the sealing area 410 through the access hole 708.

The access hole 708 is formed in the third oxide layer 707 by, for example, lithography and etching (e.g., RIE). After forming the access hole 708, the fluidic device 400 can be diced and cleaned. After final processing and cleaning, the sacrificial material 505 plug is removed by using an etchant, for example, $XeF_2$.

Figure 9A:
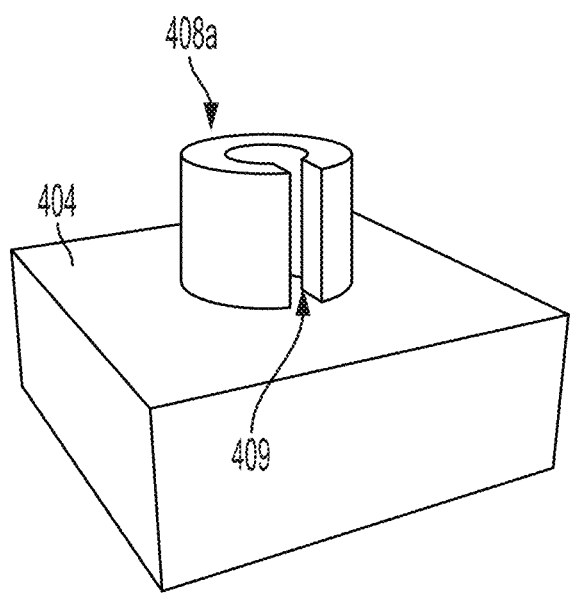

FIGS. 9A-9E depict a process flow for forming and using an extraction column according to embodiments of the present invention. FIG. 9A depicts a perspective view of an extraction column 408a. The extraction column 408a is formed in the oxide material 404 and includes an access opening 409 with a slit to the exterior of the extraction column 408a.

Figure 9B:
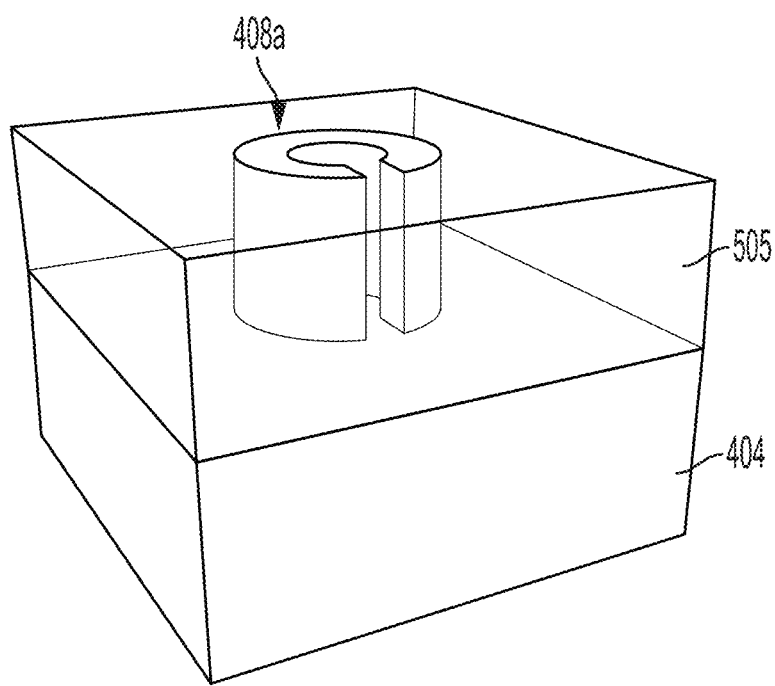

FIG. 9B depicts a perspective view of the extraction column 408a, subsequent to depositing a sacrificial material 505 on the extraction column 408a. The sacrificial material 505 fills the center of extraction column 408a within the access opening 409 and surrounds the extraction column 408a. The sacrificial material 505 is polished back to expose the surface of the extraction column 408a.

Figure 9C:
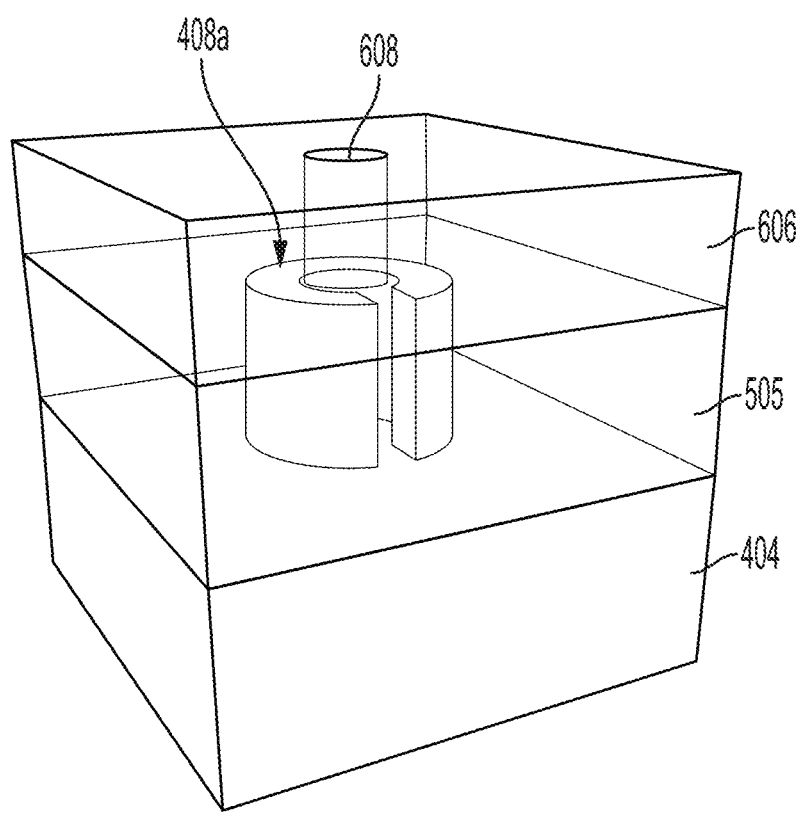

FIG. 9C depicts a perspective view of the extraction column 408a, subsequent to depositing a second oxide layer 606 and forming a vent hole 608 within the second oxide layer 606. The vent hole 608 is aligned with the access opening 409 in the center of the extraction column 408a beneath.

Figure 9D:
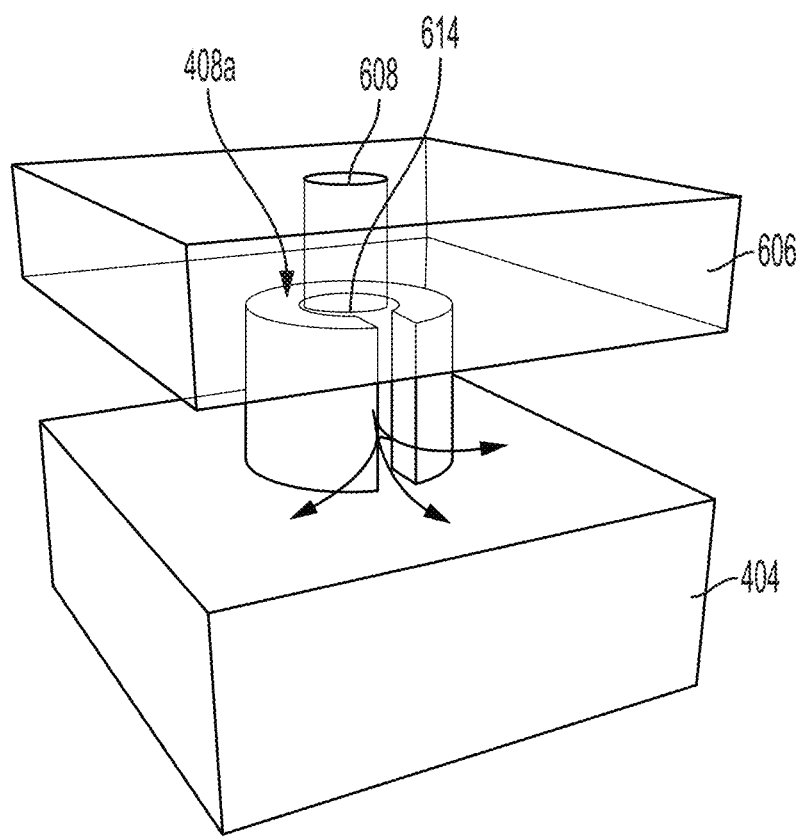

FIG. 9D depicts a perspective view of the extraction column 408a, subsequent to extracting the surrounding sacrificial material 505. An etchant or other material, for example, $XeF_2$, is used to extract the sacrificial material 505. The etchant used to push the sacrificial material 505 out from within the extraction column 408a will follow the flow path 614 indicated by the arrows.

Figure 9E:
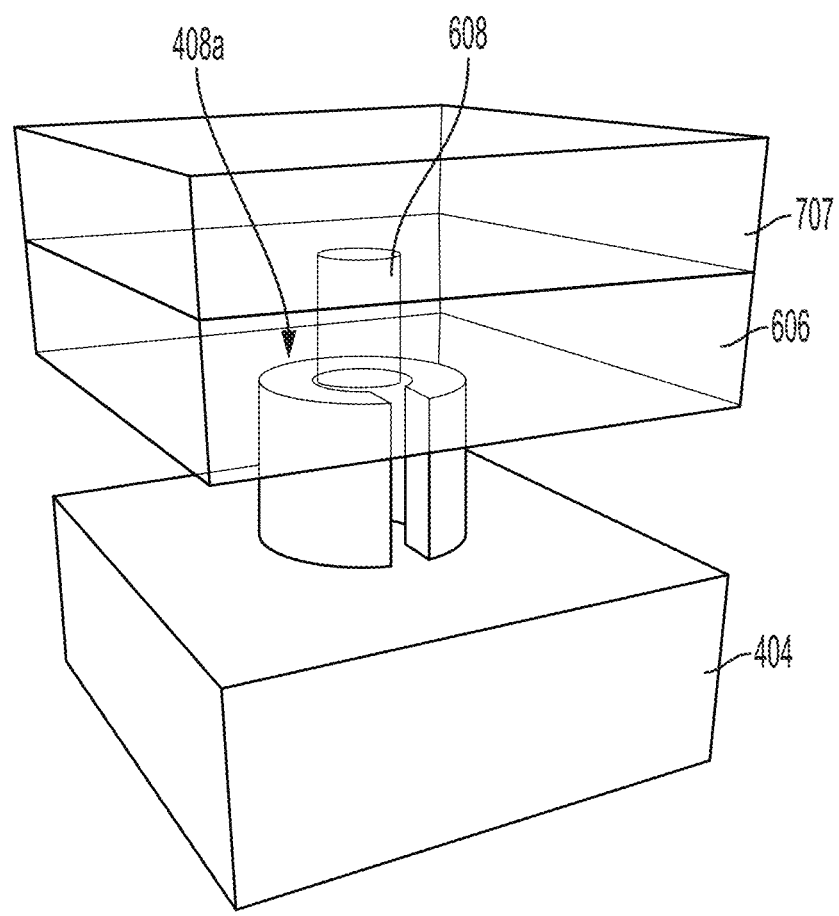

FIG. 9E depicts a perspective view of the extraction column 408a, subsequent to closing the vent hole 608 by depositing a third oxide layer 707 on the second oxide layer 606. The third oxide layer 707 is deposited by, for example, PECVD to seal the microfluidic cavity.

Figure 10A:
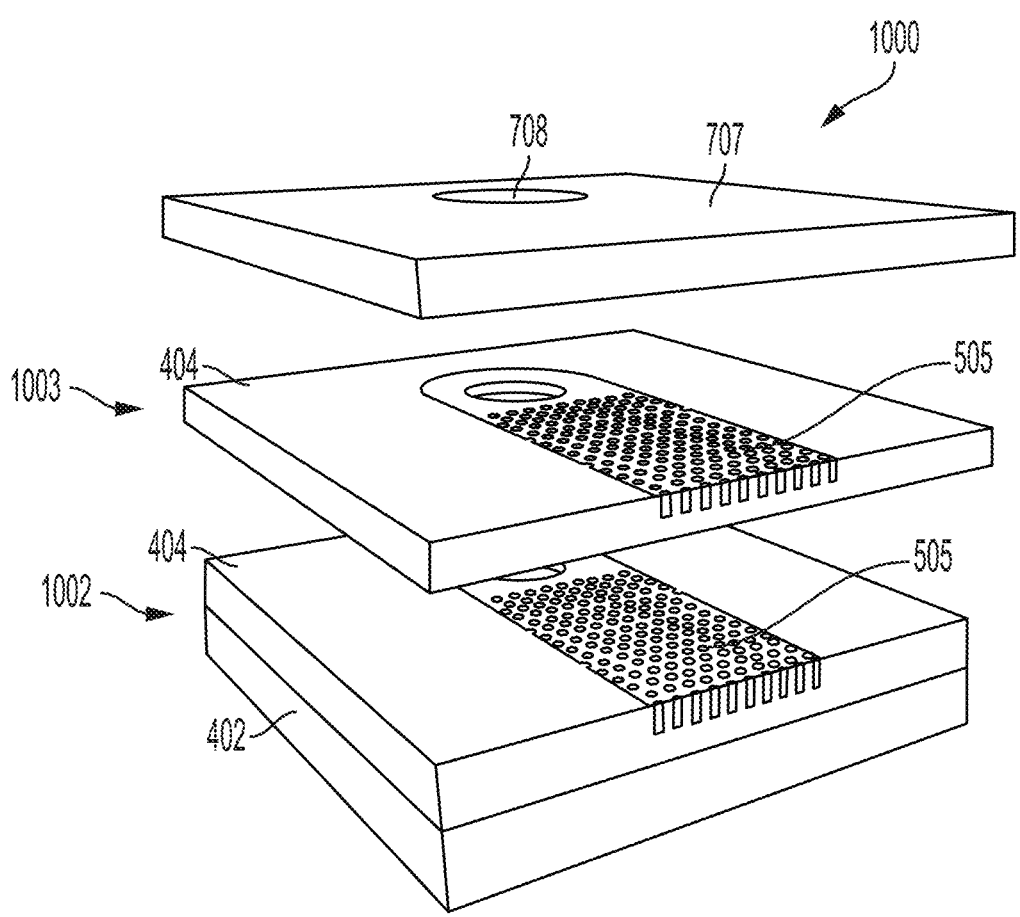
FIG. 10A depicts an exploded view of a stacked pillar array according to embodiments of the present invention.
Figure 10B:
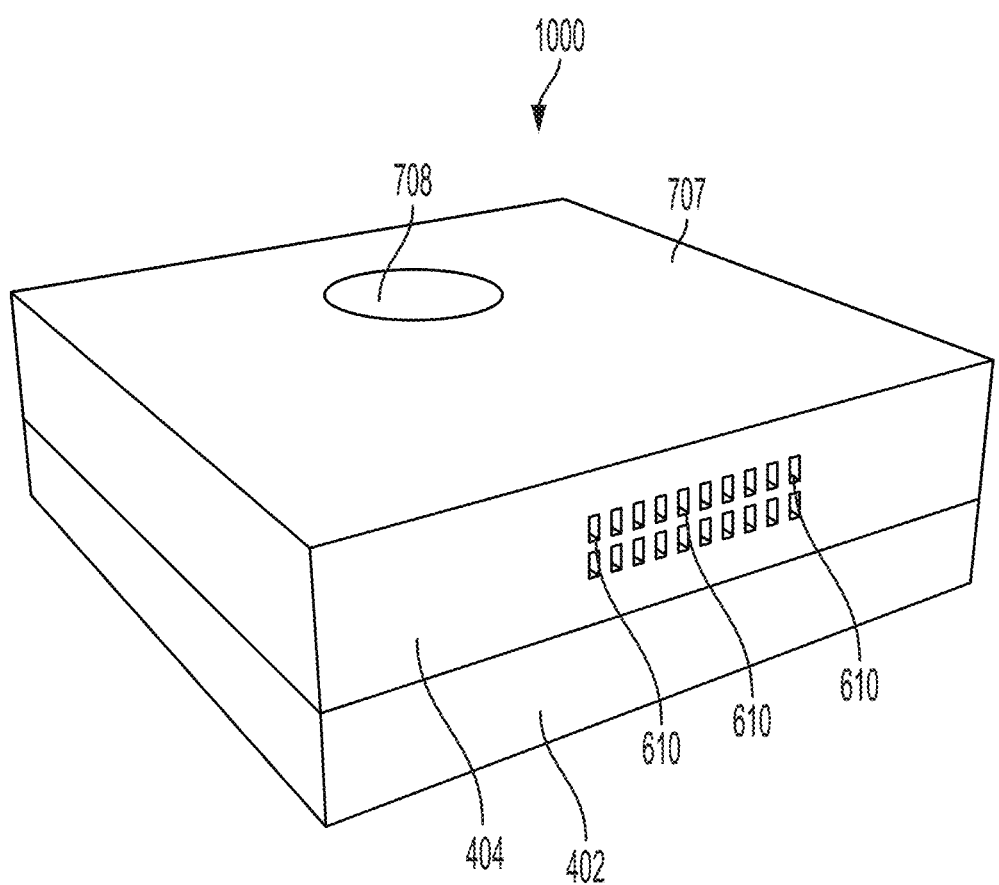
FIG. 10B depicts a perspective view of the stacked pillar array of FIG. 10A, subsequent to removing the sacrificial material.

FIG. 10A depicts an exploded view of a stacked pillar array 1000 including the sacrificial material 505 according to embodiments of the present invention. FIG. 10B depicts a perspective view of the stacked pillar array 1000 of FIG. 10A, subsequent to removing the sacrificial material 505. The above described process flows for forming fluidic devices can be repeated over two or more layers (first chip 1002 with first pillar array and second chip 1003 with second pillar array), which are then stacked, to linearly improve the volume throughput for a single chip.

EXAMPLES

Figure 11A:
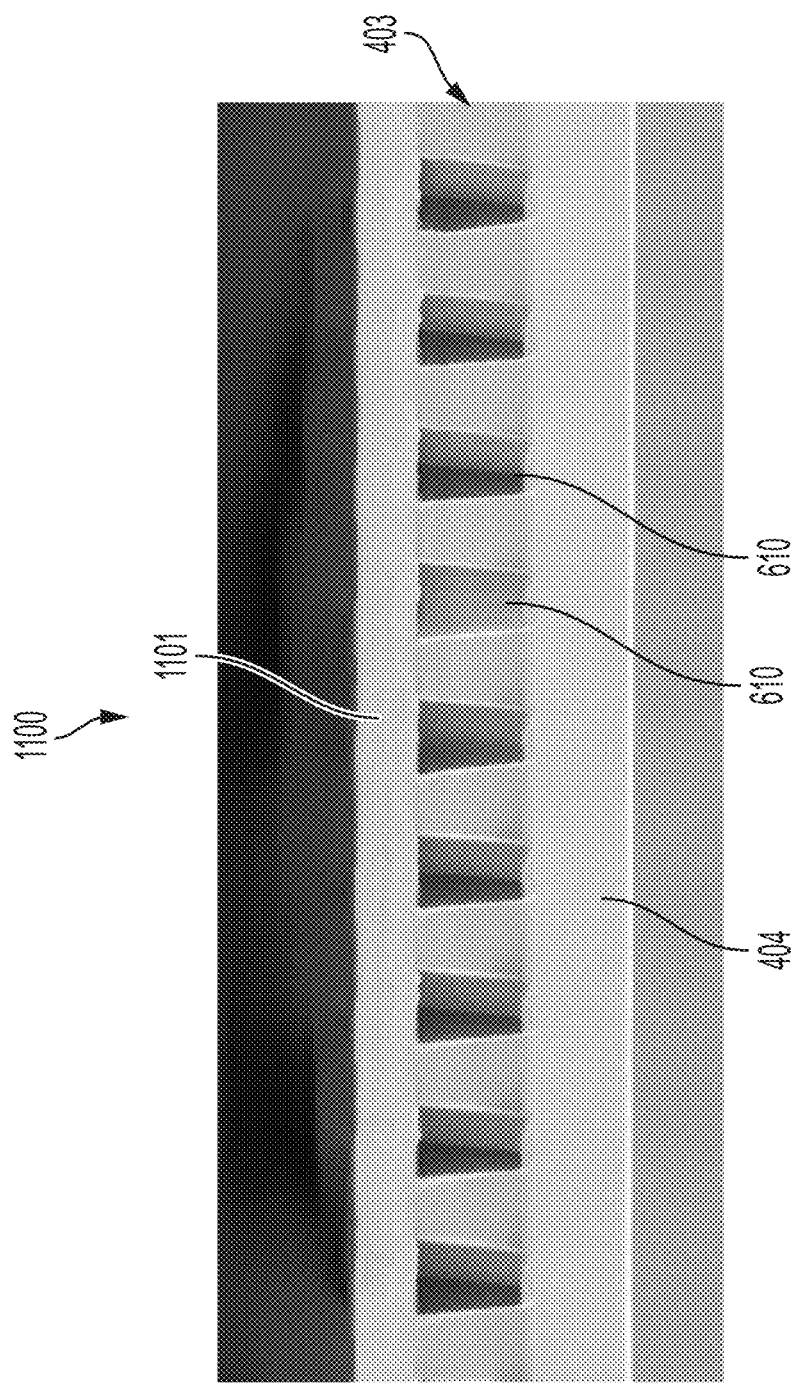
FIG. 11A depicts an electron micrograph of a pillar array according to embodiments of the present invention.

FIG. 11A depicts an electron micrograph 1100 of a pillar array 403 according to embodiments of the present invention. A pillar array 403 was formed in an oxide material 404. Vent holes were formed in an oxide layer deposited on top of the pillar array 403, and another oxide layer 1101 sealed the microfluidic cavity.

Figure 11B:
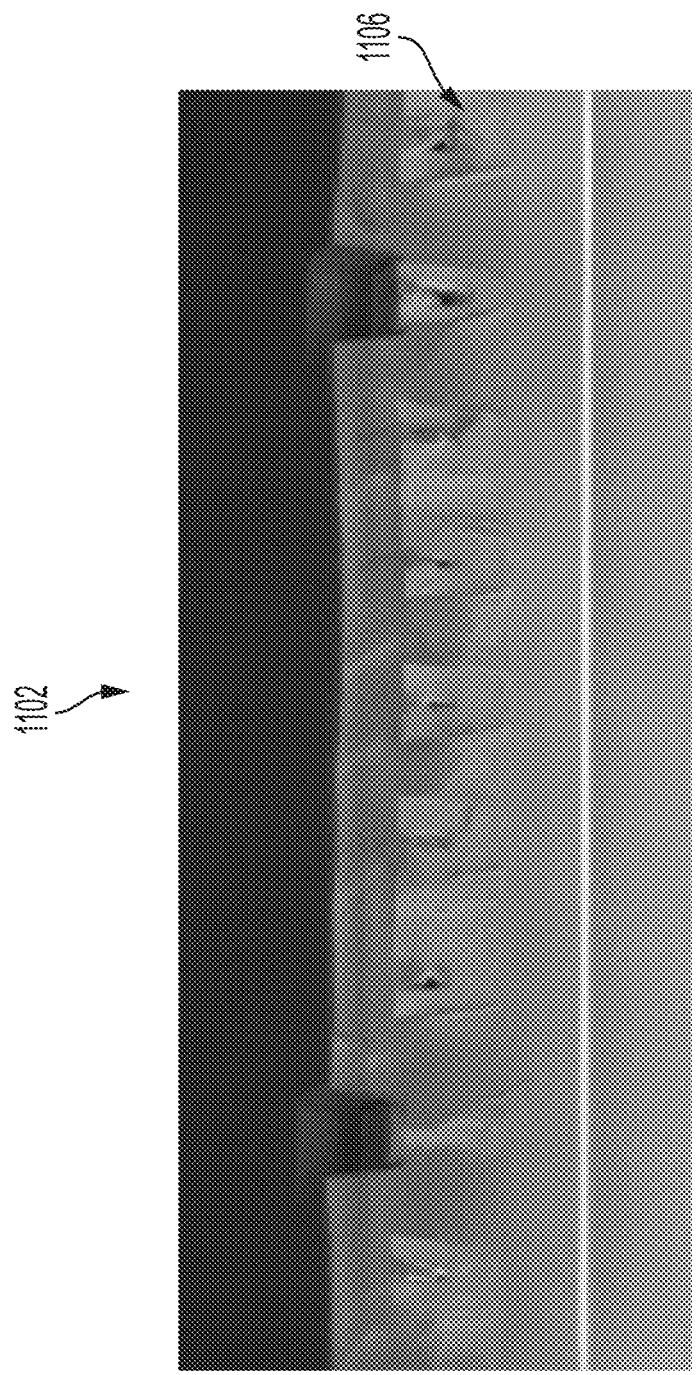
FIG. 11B depicts an electron micrograph of pillar array according to embodiments of the present invention.

FIG. 11B depicts an electron micrograph 1102 of a pillar array 1106 according to embodiments of the present invention. FIG. 11B shows a cross section of a pillar array with a sacrificial polysilicon fill, an oxide layer on top, and with vent holes open, just prior to $XeF_2$ removal of the polysilicon that leads to FIG. 11A.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a fluidic device, the method comprising:
   depositing a sacrificial material on a pillar array arranged on a substrate, the pillar array having an extraction column arranged between pillars of the pillar array, the extraction column being a column with at least one slit within a vertical sidewall of the column;
   removing a portion of the sacrificial material; and
   depositing a sealing layer on the pillar array to form a sealed fluidic cavity.

2. The method of claim 1, wherein the extraction column includes three slits or four slits within the vertical sidewall of the column.

3. The method of claim 1, wherein the sacrificial material is polysilicon.

* * * * *